(12) United States Patent
Shigeta et al.

(10) Patent No.: US 8,963,971 B2
(45) Date of Patent: Feb. 24, 2015

(54) LASER EXPOSURE METHOD AND PRODUCT

(75) Inventors: Tatsuo Shigeta, Chiba (JP); Hitoshi Horiuchi, Chiba (JP)

(73) Assignee: Think Laboratory Co., Ltd, Chiba (JP)

( * ) Notice: Subject to any disclaimer, the term of this patent is extended or adjusted under 35 U.S.C. 154(b) by 355 days.

(21) Appl. No.: 13/582,109

(22) PCT Filed: May 23, 2011

(86) PCT No.: PCT/JP2011/061719
§ 371 (c)(1),
(2), (4) Date: Aug. 31, 2012

(87) PCT Pub. No.: WO2011/152235
PCT Pub. Date: Dec. 8, 2011

(65) Prior Publication Data
US 2012/0327388 A1    Dec. 27, 2012

(30) Foreign Application Priority Data

Jun. 4, 2010   (JP) .................. 2010-129076

(51) Int. Cl.
*B41J 2/385* (2006.01)
*G03G 13/04* (2006.01)
*B41J 2/47* (2006.01)
*G03F 7/20* (2006.01)

(52) U.S. Cl.
CPC ............ *G03F 7/2053* (2013.01); *G03F 7/2055* (2013.01)
USPC ............................ 347/135; 347/239; 347/255

(58) Field of Classification Search
USPC ......................................... 347/135, 239, 255
See application file for complete search history.

(56) References Cited

U.S. PATENT DOCUMENTS

| 6,266,080 | B1 | 7/2001 | Gelbart |
| 7,330,203 | B2 | 2/2008 | Beier et al. |
| 2002/0154207 | A1* | 10/2002 | Beier et al. ................... 347/233 |
| 2006/0060798 | A1* | 3/2006 | Miyagawa ............... 250/492.22 |
| 2006/0147841 | A1 | 7/2006 | Ohmi et al. |
| 2011/0039213 | A1 | 2/2011 | Fourkas et al. |

FOREIGN PATENT DOCUMENTS

| EP | 1662552 A1 | 5/2006 |
| JP | 10-193551 A | 7/1998 |
| JP | 2000-318195 A | 11/2000 |

(Continued)

*Primary Examiner* — Justin Seo
*Assistant Examiner* — Kendrick Liu
(74) *Attorney, Agent, or Firm* — McGlew and Tuttle, P.C.

(57) ABSTRACT

Provided are a high-resolution laser exposure method and a product manufactured with use of the laser exposure method, the laser exposure method being capable of performing high-resolution laser plate-making in gravure plate-making, offset plate-making, flexo plate-making, and the like, and being usable in laser exposure of a circuit pattern in an electronic component such as a printed circuit board, a liquid crystal display, and a plasma display, or in special printing for prevention of forgery of banknotes and the like. The laser exposure method, which uses a laser exposure apparatus, includes: scanning laser beams to form a laser spot array having a predetermined length on a photosensitive film; and exposing the photosensitive film coated on a plate surface to light, to thereby form a photosensitized part and a non-photosensitized part. The scanning includes sequentially scanning, for exposure, a subsequent laser spot array so that at least a half region of a previously scanned laser spot array in a width direction thereof is subjected to superimposed exposure.

4 Claims, 8 Drawing Sheets

(56) References Cited

FOREIGN PATENT DOCUMENTS

| JP | 2002-113836 A | 4/2002 |
| JP | 2004-319581 A1 | 11/2004 |
| JP | 2006-53499 A | 2/2006 |
| WO | 98/33096 A1 | 7/1998 |
| WO | 00/02424 A1 | 1/2000 |
| WO | 2004/095549 A1 | 11/2004 |
| WO | 2006/110073 A1 | 10/2006 |

* cited by examiner

LASER EXPOSURE METHOD AND PRODUCT

TECHNICAL FIELD

The present invention relates to a high-resolution laser exposure method, which is usable in laser plate-making such as gravure plate-making, offset plate-making, and flexo plate-making, and further usable in laser exposure of a circuit pattern in an electronic component such as a printed circuit board, a liquid crystal display, and a plasma display, or in special printing for prevention of forgery of banknotes and the like, and relates to a product manufactured with use of the laser exposure method.

BACKGROUND ART

In gravure printing, ink is filled in fine concave portions (cells) formed in a surface of a cylindrical plate cylinder (gravure cylinder), and while extra ink is scraped by a doctor, the plate cylinder is pressed against a medium to be printed (paper and the like), to thereby transfer the ink in the cells to the medium to be printed. Depending on the degree of the depth of the cell, the gradation or shading of the ink is expressed. Plate-making in gravure printing is performed by forming the cells in the surface of the gravure cylinder, and this has been conventionally performed by mechanical engraving. In recent years, however, from the viewpoint of high-definition printing, productivity improvement, or the like, laser plate-making, in which direct exposure of plate-making information (digital data of characters, images, and the like) is performed by an X-Y scanning type laser exposure apparatus using a semiconductor laser, has become the mainstream. In the laser plate-making, a photosensitive material film coated on the surface of the gravure cylinder rotating at high speed is subjected to exposure with use of semiconductor laser light having a wavelength of, for example, 830 nm, which is optically modulated by the plate-making information, and then subjected to development and etching, to thereby form a surface hardening film such as a chromium plated film. The laser plate-making is particularly suitably used in a so-called computer to plate (CTP) system, which performs plate-making by outputting the digital data of the plate-making information, such as characters and images, directly onto a plate without output to a film. Further, the laser plate-making is not only used in gravure plate-making, but also used in various types of plate-making such as offset plate-making and flexo plate-making. The inventors of the present invention have already developed a laser plate-making system in which all steps of this laser plate-making are fully automated, and have gained a high popularity (for example, Patent Document 1 and the like).

Currently, as a laser exposure method for laser gravure plate-making, a method with a resolution of about 3,200 dots per inch (dpi) is in widespread use. In this case, one pixel is expressed by about $7.9^2$ μm$^2$. It can be said that this resolution of 3,200 dpi provides sufficient performance in the general printing field, for example, printing of normal books, magazines, catalogs, and packaging films. However, a higher resolution is required in a case where, in the field of manufacture of an electronic component, such as a printed circuit board, a liquid crystal display, and a plasma display, which has a possibility as an application field, exposure of various circuit patterns is performed by an X-Y scanning type laser exposure apparatus instead of performing one-shot exposure or step exposure with use of an overlapped mask film as in the conventional case, or in a case of special printing for prevention of forgery of banknotes and the like.

A conventional laser exposure method with a resolution of 3,200 dpi in a sub-scanning direction and 3,200 dpi in a main scanning direction is described with reference to FIG. 9.

Referring to FIG. 9, description is made of a method of a case where exposure is performed with respect to a cylinder for gravure plate-making, which has a photosensitive film coated thereon, with use of a conventional laser exposure apparatus including a laser head portion. The laser head portion includes a laser light source for oscillating laser light, a light modulation portion for spatially arraying and partitioning the laser light by a plurality of control signals to obtain a plurality of laser beams, a projection optical portion for performing reduced size projection of the arrayed laser beams exiting from the light modulation portion, and scanning means for scanning the laser beams with respect to the photosensitive film. In the example of FIG. 9, 208 laser beams are used, and each laser spot has a square shape and sized so that the height is about 7.9 μm and the width is about 7.9 μm.

Under a state in which the cylinder having the photosensitive film coated thereon is rotated, the laser head portion is scanned in a spiral manner to perform exposure.

First, in a first rotation of the cylinder, a laser spot array having a predetermined length is formed for exposure on the photosensitive film by the 208 laser beams.

In a second rotation of the cylinder, a laser spot array is sub-scanned based on the following expression (1) so that beams to be applied are superimposed only on the 208th beam applied in the first rotation, and the beams are applied. In this case, only a region corresponding to the 208th beam applied in the first rotation is subjected to superimposed exposure.

$$\text{Pitch } 25.4/3{,}200 \times 207 = 1{,}643 \text{ mm} \tag{1}$$

Next, in a third rotation of the cylinder, beams are applied so as to be superimposed on the 208th beam applied in the second rotation. In this case, a region corresponding to the 208th beam applied in the first rotation is subjected to superimposed exposure.

As described above, laser exposure with a resolution of 3,200 dpi×3,200 dpi is performed.

Further, recently, in order to further increase the resolution, there has been developed a laser exposure apparatus which generates a rectangular laser spot in which the height of the laser spot is approximately half of 7.9 μm, which is the size of the conventional laser spot. With such a laser exposure apparatus, laser exposure with a resolution of 3,200 dpi×6,400 dpi is possible.

Such a laser exposure method with a resolution of 3,200 dpi in the sub-scanning direction and 6,400 dpi in the main scanning direction is described with reference to FIG. 10.

Referring to FIG. 10, description is made of a method of a case where exposure is performed with respect to a cylinder for gravure plate-making, which has a photosensitive film coated thereon, with use of a conventional laser exposure apparatus including a laser head portion. The laser head portion includes a laser light source for oscillating laser light, a light modulation portion for spatially arraying and partitioning the laser light by a plurality of control signals to obtain a plurality of laser beams, a projection optical portion for performing reduced size projection of the arrayed laser beams exiting from the light modulation portion, and scanning means for scanning the laser beams with respect to the photosensitive film. In the example of FIG. 10, 208 laser beams are used, and each laser spot has a rectangular shape and sized so that the width is about 7.9 μm and the height is half the width.

Under a state in which the cylinder having the photosensitive film coated thereon is rotated, the laser head portion is scanned in a spiral manner to perform exposure.

First, in a first rotation of the cylinder, a laser spot array having a predetermined length is formed for exposure on the photosensitive film by the 208 laser beams.

In a second rotation of the cylinder, beams are applied based on the following expression (1) so as to be superimposed only on the 208th beam applied in the first rotation. In this case, only a region corresponding to the 208th beam applied in the first rotation is subjected to superimposed exposure.

$$\text{Pitch } 25.4/3{,}200 \times 207 = 1.643 \text{ mm} \quad (1)$$

Next, in a third rotation of the cylinder, beams are applied so as to be superimposed on the 208th beam applied in the second rotation. In this case, a region corresponding to the 208th beam applied in the first rotation is subjected to superimposed exposure.

As described above, laser exposure with a resolution of 3,200 dpi×6,400 dpi is performed.

Recently, further increase in resolution has been demanded, but even though the height direction of the laser spot can be decreased as described above, developing a laser exposure apparatus which generates a laser spot with a further decreased size in a width direction has been quite difficult.

Further, a scan line method using individually drivable single stripe laser diodes is proposed (Patent Document 2).

However, it is preferred to achieve high resolution with use of the existing apparatus in terms of cost and the like.

In view of this, as a result of diligent studies, the inventors of the present invention have found a laser exposure method which is capable of achieving high resolution with use of the existing apparatus, which is covered in this proposal.

CITATION LIST

Patent Documents

[Patent Document 1] JP 10-193551 A
[Patent Document 2] JP 2002-113836 A
[Patent Document 3] JP 2000-318195 A

SUMMARY OF INVENTION

Technical Problems

The present invention has been made in view of the above-mentioned problems inherent in the conventional technology, and has an object to provide a high-resolution laser exposure method, which enables high-resolution laser plate-making in gravure plate-making, offset plate-making, flexo plate-making, and the like with use of a laser exposure apparatus which exhibits a performance equivalent to a conventional, relatively inexpensive laser exposure apparatus with a resolution of about 3,200 dpi, and is usable in laser exposure of a circuit pattern in an electronic component such as a printed circuit board, a liquid crystal display, and a plasma display, or in special printing for prevention of forgery of banknotes and the like, and to provide a product manufactured with use of the laser exposure method.

Solution to Problems

According to the present invention, there is provided a laser exposure method, which uses a laser exposure apparatus including a laser head portion including: a laser light source for oscillating laser light; a light modulation portion for spatially arraying and partitioning the laser light by a plurality of control signals to obtain a plurality of laser beams; a projection optical portion for performing reduced size projection of the plurality of arrayed laser beams exiting from the light modulation portion; and scanning means for scanning the plurality of laser beams with respect to a photosensitive film, the laser head portion generating a plurality of laser spots to be arrayed on an imaging portion of the projection optical portion, the plurality of laser spots each including a rectangular laser spot having a rectangular shape in which a size in a width direction is larger than a size in a height direction orthogonal to the width direction, the laser exposure method including: scanning the plurality of laser beams to form a laser spot array having a predetermined length on the photosensitive film; and exposing the photosensitive film coated on a plate surface to light, to thereby form a photosensitized part and a non-photosensitized part, in which the scanning includes sequentially scanning, for exposure, a subsequent laser spot array so that at least a half region of a previously scanned laser spot array in a width direction thereof is subjected to superimposed exposure.

As the scanning means, it is preferred to use scanning means for scanning the laser beam in a main scanning direction and a sub-scanning direction, the main scanning direction being a direction in which the laser beam is scanned relatively in a direction intersecting an arraying direction of the laser spot array applied on the photosensitive film, the sub-scanning direction being a direction in which the laser beam is scanned relatively in a direction orthogonal to the main scanning direction.

When the exposure is performed as described above, an exposure area is increased by an amount of subtracting a superimposed exposure part with respect to the previously scanned laser spot array from the subsequently scanned laser spot array, and hence compared to a conventional case where the laser spot array is scanned so that the laser spot arrays are applied substantially parallel to each other, the exposure region is reduced. Thus, an increase in resolution can be achieved. In particular, an increase in resolution in the width direction of the laser spot, that is, an increase in resolution in the sub-scanning direction of the laser exposure apparatus, which has been conventionally difficult to be achieved, can be achieved.

Further, it is preferred that a number of the plurality of laser beams be odd.

Note that, it is preferred that a semiconductor laser be used as the laser light source.

According to the present invention, there is provided a product, which is manufactured with use of the laser exposure method of the present invention.

Advantageous Effects of Invention

According to the present invention, there is produced such a remarkable effect that it is possible to provide the high-resolution laser exposure method, which enables high-resolution laser plate-making in gravure plate-making, offset plate-making, flexo plate-making, and the like with use of a laser exposure apparatus which exhibits a performance equivalent to a conventional, relatively inexpensive laser exposure apparatus with a resolution of about 3,200 dpi, and is usable in laser exposure of a circuit pattern in an electronic component such as a printed circuit board, a liquid crystal display, and a plasma display, or in special printing for prevention of forgery of banknotes and the like, and to provide the product manufactured with use of the laser exposure method.

DESCRIPTION OF EMBODIMENT

Hereinafter, an embodiment of the present invention is described with reference to the attached drawings. Illustrated examples are shown for illustrative purposes, and hence it is needless to say that various modifications may be made thereto without departing from the technical spirit of the present invention.

Figure 3:
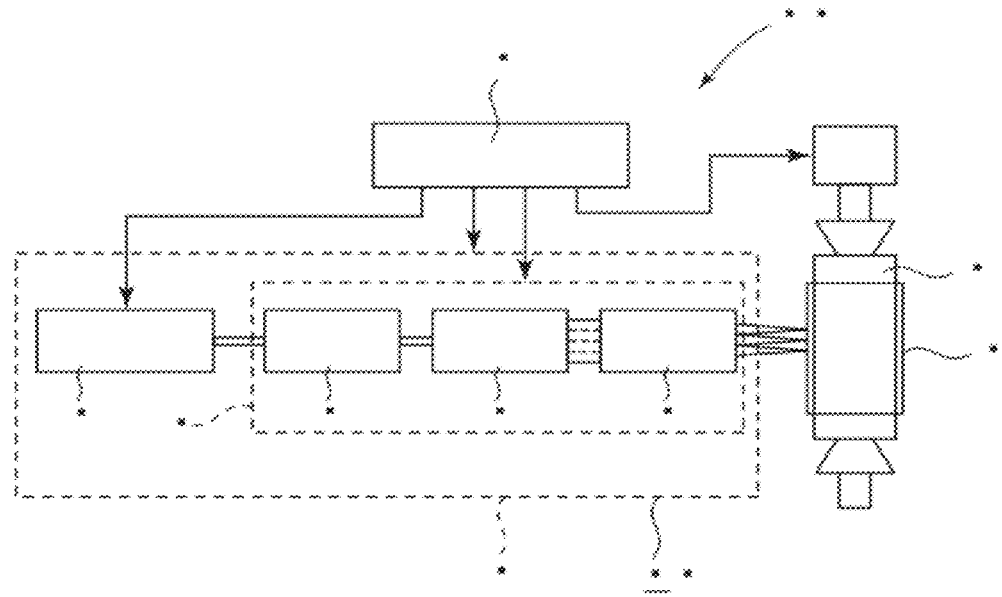
FIG. 3 is a block diagram illustrating a basic apparatus configuration of a laser exposure apparatus to be used in the laser exposure method according to the present invention.

First, an apparatus configuration of a laser exposure apparatus to be used in a laser exposure method according to the present invention is described below. FIG. 3 is a block diagram illustrating the basic apparatus configuration of the laser exposure apparatus according to the present invention. In FIG. 3, reference numeral 10 represents the laser exposure apparatus, and the laser exposure apparatus 10 includes a laser head portion 11 including a scanning mechanism 4, which serves as scanning means for scanning a laser beam in a main scanning direction and a sub-scanning direction, the main scanning direction being a direction in which the laser beam is scanned relatively in a direction intersecting an arraying direction of a laser spot array applied on the photosensitive film, the sub-scanning direction being a direction orthogonal to the main scanning direction. The laser head portion 11 includes a laser light source 1, and a beam shaping and applying portion 2 for shaping laser light into a rectangular laser spot, which has a rectangular shape in which a size in a width direction is larger than a size in a height direction orthogonal to the width direction. Further, the laser exposure apparatus 10 includes a control portion 3 for controlling, based on plate-making information, operations of the laser light source 1, the beam shaping and applying portion 2, the scanning mechanism 4 of the laser head portion 11, and a plate cylinder 5. The plate cylinder 5 which is a target of plate-making has a surface having a photosensitive material coated thereon, which corresponds to a plate surface 6 having a photosensitive film formed thereon.

The laser light source 1 is a semiconductor laser including a plurality of laser oscillating portions of semiconductor laser light having a wavelength of, for example, 830 nm, and performs continuous laser oscillation. The laser light emitted from the laser light source 1 enters the beam shaping and applying portion 2.

The beam shaping and applying portion 2 includes an aperture shaping portion 7, a light modulation portion 8, and a projection optical portion 9. The aperture shaping portion 7 shapes the beam shape of the entering laser light in conformity to an incident aperture of the light modulation portion 8, and causes the shaped laser light to enter the light modulation portion 8. In the present invention, the shape of the laser spot needs to be rectangular, and hence the beam shape is shaped rectangular as well. Note that, the beam shape may be shaped rectangular by any known method, but for example, the laser light may be caused to pass through a light valve having a rectangular hole (see Patent Document 3).

The light modulation portion 8 is a light modulation portion which is formed of, for example, a liquid crystal type space modulator including several tens to several hundreds of independent light modulation apertures, a minute mirror array to be electrically driven, or an acoustooptics space modulator, and performs light modulation control by spatially arraying and partitioning the laser light by a plurality of signals based on the plate-making information. For example, in a case of a diffraction grating type mirror array in which a large number of minute mirrors to be electrically driven are arrayed, several elements are driven and controlled as one channel, and light intensity modulation of a laser light beam entering with about 200 kHz is possible. Thus, the mirror array may be used as independent optical modulators of several hundreds of channels. In response to a modulation signal from the control portion 3, to which the plate-making information is imparted, the laser light beams are respectively individually subjected to intensity modulation, and exit as arrayed, pulsed, and diffracted light of several hundreds of channels.

The laser light rays exiting from the light modulation portion 8 and subjected to light modulation, respectively, are formed into arrayed laser light beams corresponding to the independent light modulation apertures, and those laser light beams are caused to enter the projection optical portion 9. The projection optical portion 9 is a reduced size projection optical system including a plurality of lens for performing reduced size projection of the incident light at a predetermined magnification, and has a lens system, an automatic focus function, and the like. Further, the projection optical portion 9 is a reduced optical system which has the light modulation portion 8 as an incident light source plane and the plate surface 6 as an imaging plane. The laser light beam diameter and the laser light beam interval, which are determined based on the channel shape at the position of the light modulation portion 8, are projected in reduced size on the plate surface so as to obtain a predetermined laser spot and laser spot interval. For example, when the reduction ratio of the projection optical portion is set to 10:1, the array of laser spots having the diameter of 50 μm and arrayed at the interval of 50 μm at the light modulation portion 8 is projected in reduced size as an array of laser spots having the diameter of 5 μm and arrayed at the interval of 5 μm on the plate surface 6.

Figure 4:
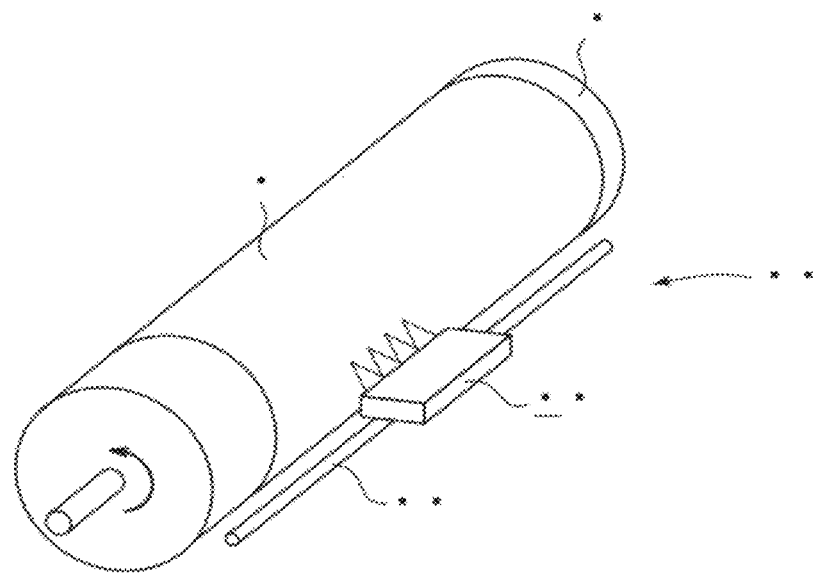
FIG. 4 is a schematic view illustrating the basic apparatus configuration of the laser exposure apparatus to be used in the laser exposure method according to the present invention.
Figure 5:
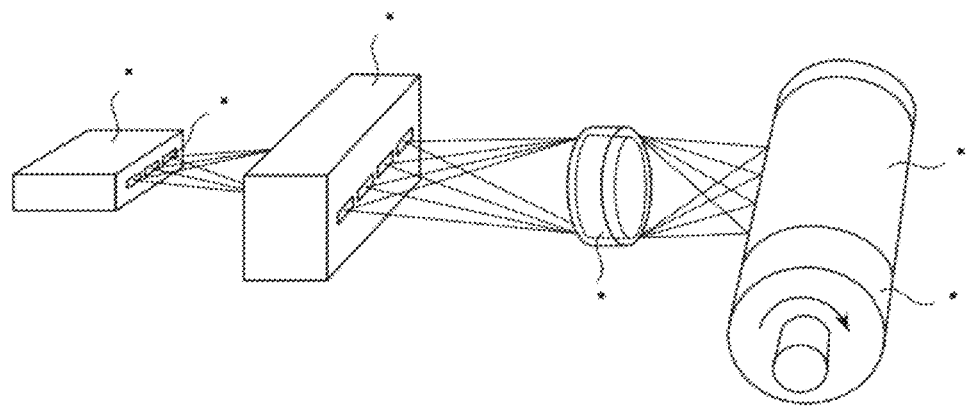
FIG. 5 is a schematic view illustrating the laser exposure apparatus of FIG. 4 in more detail.

As clearly illustrated in FIGS. 4 and 5, the laser head portion 11 having mounted thereon those optical systems including from the laser light source 1 to the projection optical portion 9 sequentially scans the laser beam based on the plate-making information with respect to the photosensitive film in the main scanning direction and in the sub-scanning direction orthogonal to the main scanning direction, by the scanning mechanism 4 via a shaft 12 along the plate cylinder 5. A photosensitive material is coated onto the plate surface 6 to form the photosensitive film. The control portion 3 enables, based on the plate-making information, rotation of the plate cylinder 5, and control of the laser scanning mechanism 4 in the main scanning direction and the sub-scanning direction.

The exposure method of the present invention, which uses such a laser exposure apparatus, includes scanning a laser beam in the main scanning direction or in the sub-scanning direction to form the laser spot array having the predetermined length on the photosensitive film, and exposing the photosensitive film coated on the plate surface to light to form a photosensitized part and a non-photosensitized part. In the scanning occurring sequentially, the subsequent laser spot array is scanned for exposure so that at least a half region of the previously scanned laser spot array in a width direction thereof is subjected to superimposed exposure. The number of the plurality of laser beams is preferred to be odd.

In the plate surface 6, a part irradiated with laser is photosensitized, and a non-irradiation part is not photosensitized, and thus the plate-making information is imparted to the entire surface of the plate cylinder 5. After that, the plate cylinder 5 is subjected to development, etching of a metal surface, resist removal, and hard film forming processing using chromium to be plated, diamond-like carbon, or the like, and thus a gravure printing plate is obtained. When a positive-type photosensitive liquid is used as the photosensitive material, the photosensitized part photolyzes. When a negative-type photosensitive liquid is used, the region subjected to exposure photocures and remains, and therefore the region not subjected to exposure can be removed by etching.

EXAMPLES

Hereinafter, examples of the present invention are described for specific description, but the examples are shown for illustrative purposes and it is needless to say that the present invention should not be limitedly interpreted by those examples.

Example 1

The laser gravure plate-making system was constructed as follows. The plate cylinder (gravure cylinder) was obtained by subjecting an aluminum gravure cylinder having a circumference of 600 mm and a width of 1,100 mm to copper plating of 80 μm, and the surface thereof was subjected to mirror polishing (surface roughness Ry=0.12 μm). As the photosensitive liquid, TSER-2104 (positive-type photosensitive liquid manufactured and distributed by THINK LABORATORY Co., Ltd.) was used. The photosensitive liquid was coated to form a photosensitive film having a thickness of 3.5 μm, and was air-dried for 45 minutes (temperature of 23° C.) after the coating. As a photosensitive liquid coating apparatus, COATING-FX-1300 (manufactured and distributed by THINK LABORATORY Co., Ltd.) was used. As the laser exposure apparatus, LaserStream-FX-1300 (manufactured and distributed by THINK LABORATORY Co., Ltd.) was used, and the exposure power and the number of revolutions of the cylinder at the time of exposure were set to 230 mJ/cm$^2$ and 200 rpm, respectively. As a developer, a TLD developer (manufactured and distributed by THINK LABORATORY Co., Ltd.) was used, and the development was performed by rotation immersion development of 80 seconds (temperature of 25° C.). A laser spot 16 of the laser exposure apparatus forming the above-mentioned system is rectangular, and 208 laser beams may be applied.

Figure 1:
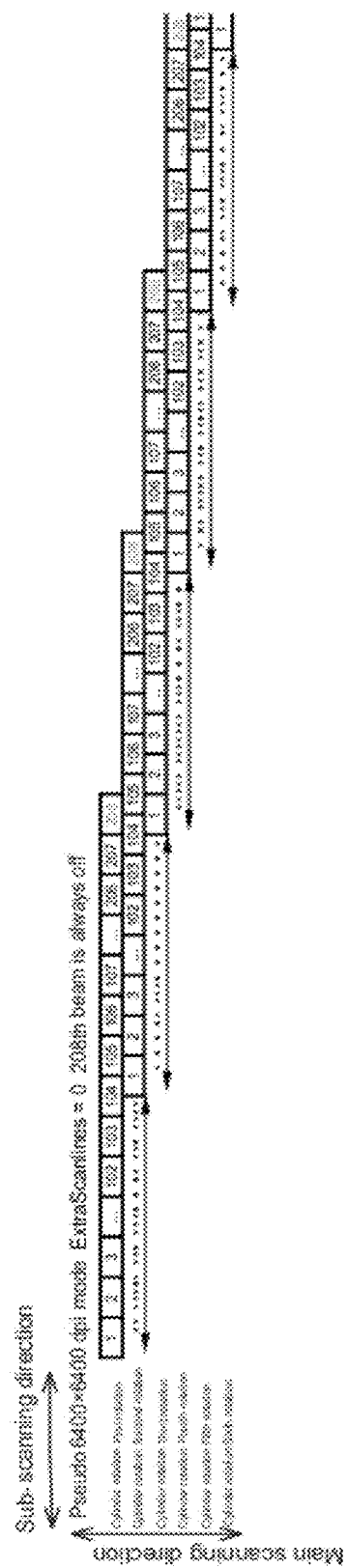
FIG. 1 is a schematic explanatory diagram illustrating a laser exposure method according to the present invention.
Figure 2:
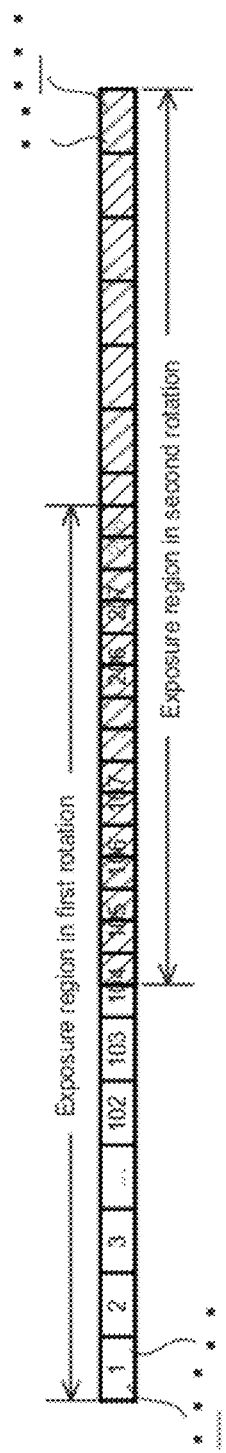
FIG. 2 is a schematic explanatory diagram illustrating a first cylinder rotation and a second cylinder rotation of FIG. 1 in more detail.

The laser exposure method which uses such a laser exposure apparatus is described with reference to FIGS. 1 and 2. The cylinder having the photosensitive film coated thereon is rotated, and first in a first rotation of the cylinder, of the 208 laser beams, the 208th laser beam is set OFF and the 207 laser beams are applied to the photosensitive film to form a laser spot array 14a having a predetermined length and perform exposure.

In a second rotation of the cylinder, a laser spot array 14b is sub-scanned based on the following expression (2) so that a half region of the array of the 207 laser spots, which are applied in the first rotation, in a width direction thereof is subjected to superimposed exposure. In this case, on the photosensitive film, the half region of the laser spot array 14a, which is formed in the first rotation, in the width direction thereof is subjected to superimposed exposure (see FIG. 2).

Pitch 25.4/3,200×103.5=0.8215 mm (2)

Next, in a third rotation of the cylinder, in the same way, a laser spot array is sub-scanned so that a half region of the array of the 207 laser spots, which are applied in the second rotation, in a width direction thereof is subjected to superimposed exposure.

Through sequential exposure as described above, it is possible to obtain an effect equivalent to that in a case where exposure is performed with use of a laser exposure apparatus with a resolution of 6,400 dpi×6,400 dpi.

Figure 6:
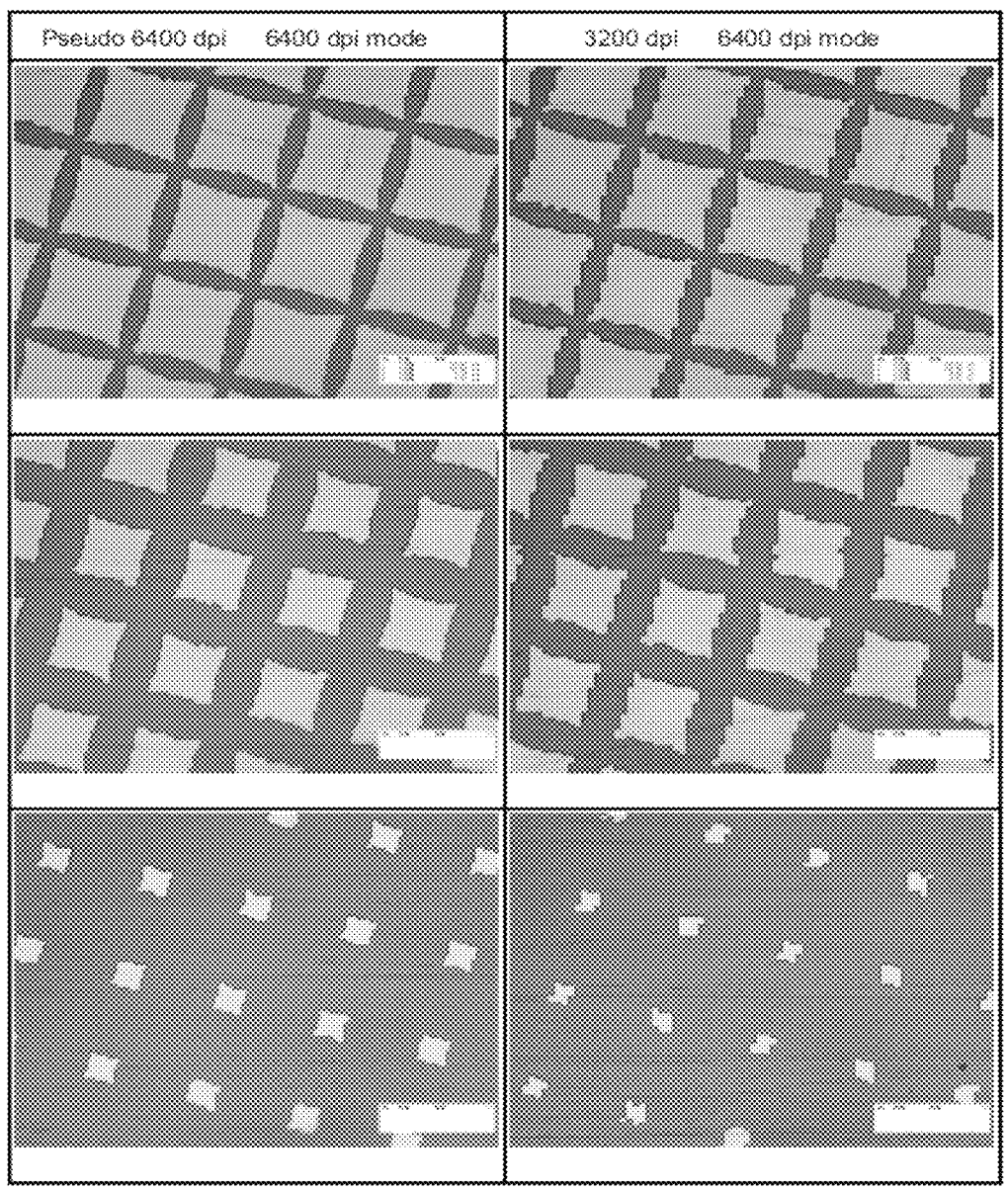
FIG. 6 shows electron micrographs of a prepared gravure cylinder, in which the part (a) shows results of Example 1 and the part (b) shows results of Comparative Example 1.
Figure 7:
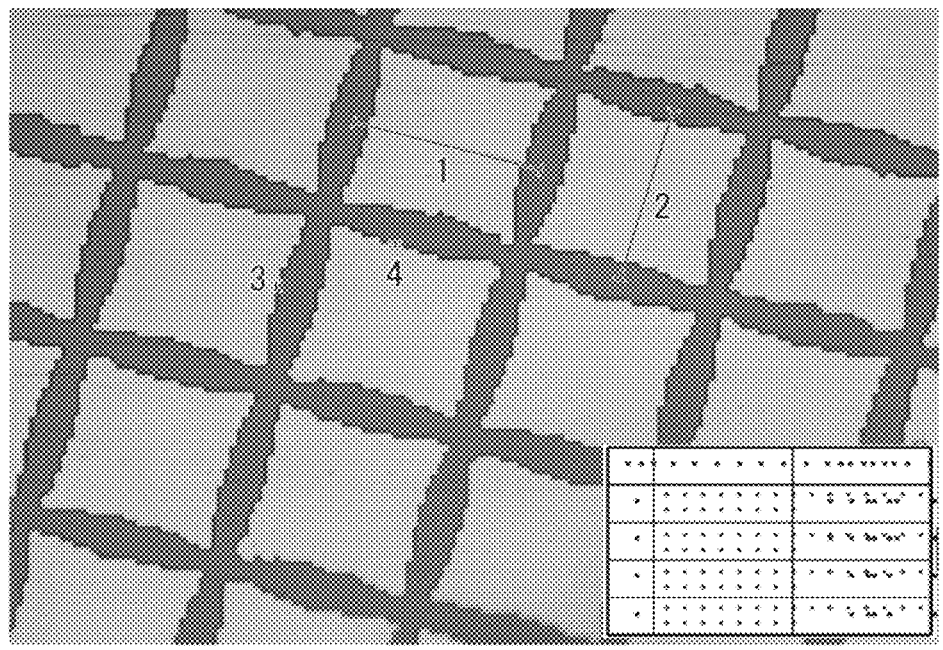
FIG. 7 is a magnified photograph of the upper section of FIG. 6(a).
Figure 8:
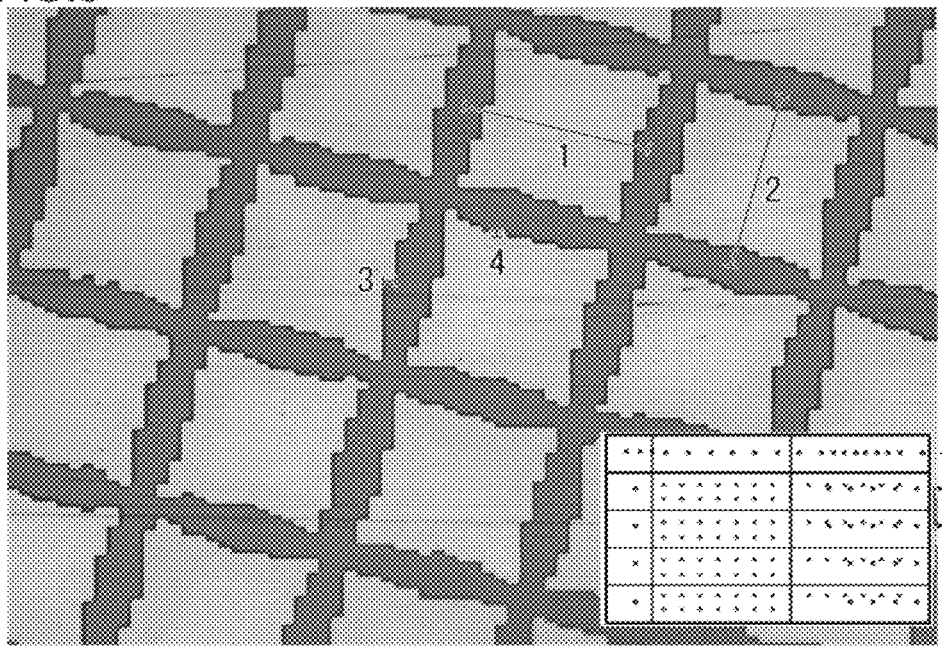
FIG. 8 is a magnified photograph of the upper section of FIG. 6(b).
Figure 9:
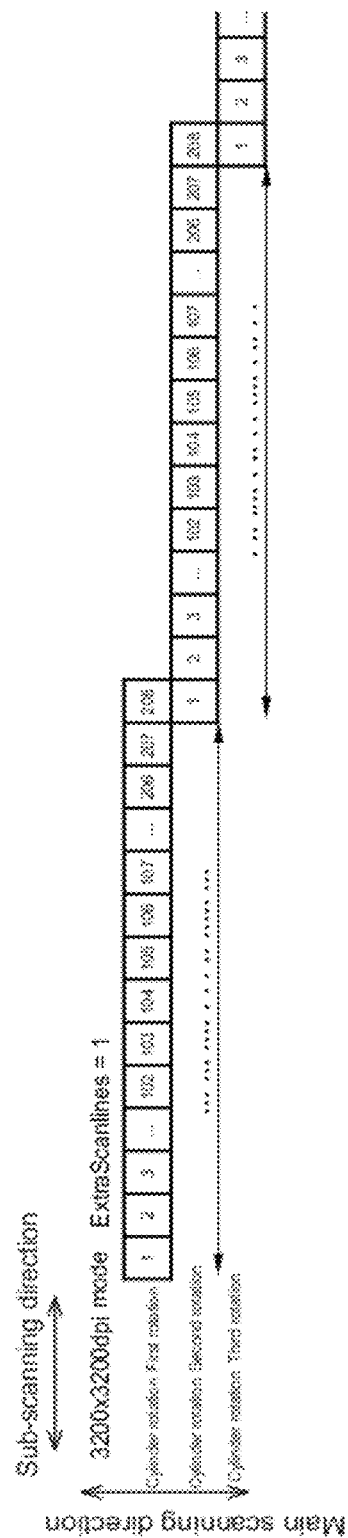
FIG. 9 is a schematic explanatory diagram illustrating a conventional laser exposure method.

Results of performing a general laser gravure plate-making except for employing the above-mentioned laser exposure method are shown in FIGS. 6(*a*) and 7. As shown in FIGS. 6(*a*) and 7, almost no steps and jagged shapes are formed in the oblique parts. Thus, it was possible to form a straight oblique line in a substantially perfect manner, and to perform fine exposure and plate-making very accurately.

Comparative Example 1

Figure 10:
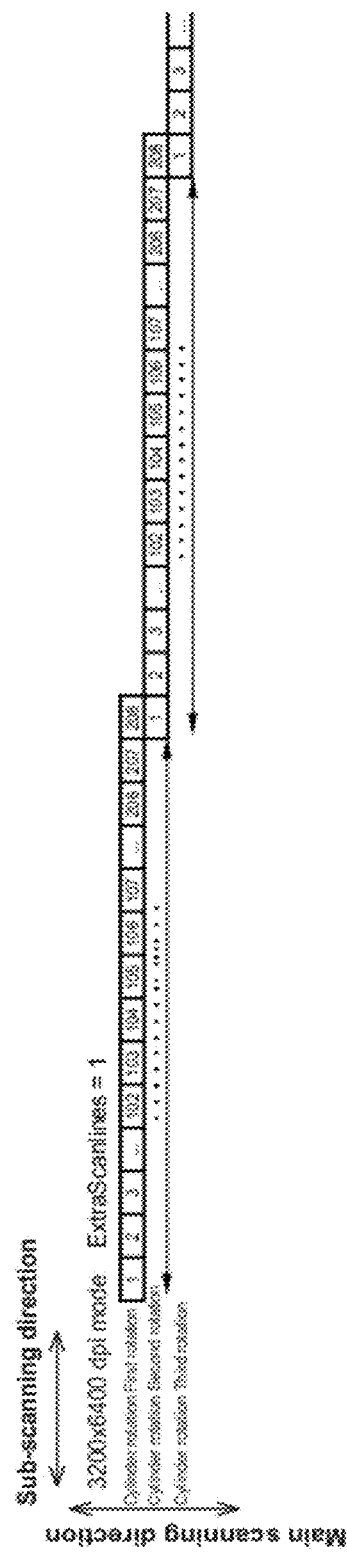
FIG. 10 is a schematic explanatory diagram illustrating a conventional laser exposure method.

With use of a laser gravure plate-making system similar to that of Example 1, laser gravure plate-making was performed similarly to Example 1 except that a laser exposure method similar to that illustrated in FIG. 10 was used in the laser exposure apparatus forming the system. Results are shown in FIGS. 6(*b*) and 8. As shown in FIGS. 6(*b*) and 8, the oblique parts have steps and jagged shapes. Thus, it was impossible to perform fine exposure and plate-making sufficiently.

INDUSTRIAL APPLICABILITY

In the above description, a case where the laser exposure method of the present invention is applied to gravure plate-making has been mainly described, but the laser exposure method of the present invention is usable not only in gravure plate-making, but also in various types of laser plate-making such as offset plate-making and flexo plate-making. Further, also in the field of manufacture of an electronic component, such as a printed circuit board, a liquid crystal display, and a plasma display, the laser exposure method of the present invention is applicable in exposure of various circuit patterns by an X-Y scanning type laser exposure apparatus instead of performing one-shot exposure or step exposure with use of an overlapped mask film as in the conventional case. Still further, the laser exposure method of the present invention is applicable in special printing for prevention of forgery of banknotes and the like.

REFERENCE SIGNS LIST

1: laser light source, 2: beam shaping and applying portion, 3: control portion, 4: laser scanning mechanism, 5: plate cylinder (gravure cylinder), 6: plate surface (photosensitive film), 7: aperture shaping portion, 8: light modulation portion, 9: projection optical portion, 10: laser exposure apparatus, 11: laser head portion, 12: shaft, 14a, 14b: laser spot array, 16: laser spot.

The invention claimed is:

1. A laser exposure method, comprising:
providing a laser exposure apparatus comprising a laser head portion, said laser head portion comprising:
a laser light source for oscillating laser light;
a light modulation portion for spatially arraying and partitioning the laser light by a plurality of control signals to obtain a plurality of laser beams;
a projection optical portion for performing reduced size projection of the plurality of arrayed laser beams exiting from the light modulation portion; and
scanning means for scanning the plurality of laser beams with respect to a photosensitive film, the laser head portion generating a plurality of laser spots to be arrayed on an imaging portion of the projection optical portion, the plurality of laser spots each comprising a rectangular laser spot having a rectangular shape in which a size in a width direction is larger than a size in a height direction orthogonal to the width direction;
scanning the plurality of laser beams to form a laser spot array having a predetermined length on the photosensitive film; and
exposing the photosensitive film coated on a plate surface to light, to thereby form a photosensitized part and a non-photosensitized part, wherein the scanning comprises sequentially scanning, for exposure, a subsequent laser spot array so that at least a half region of a previously scanned laser spot array in the width direction thereof is subjected to superimposed exposure.

2. A laser exposure method according to claim 1, wherein a number of the plurality of laser beams is odd.

3. A product, which is manufactured with use of the laser exposure method, the method comprising:
providing a laser exposure apparatus comprising a laser head portion, said laser head portion comprising:
a laser light source for oscillating laser light;
a light modulation portion for spatially arraying and partitioning the laser light by a plurality of control signals to obtain a plurality of laser beams;
a projection optical portion for performing reduced size projection of the plurality of arrayed laser beams exiting from the light modulation portion; and
scanning means for scanning the plurality of laser beams with respect to a photosensitive film, the laser head portion generating a plurality of laser spots to be arrayed on an imaging portion of the projection optical portion, the plurality of laser spots each comprising a rectangular laser spot having a rectangular shape in which a size in a width direction is larger than a size in a height direction orthogonal to the width direction;
scanning the plurality of laser beams to form a laser spot array having a predetermined length on the photosensitive film; and
exposing the photosensitive film coated on a plate surface to light, to thereby form a photosensitized part and a non-photosensitized part, wherein the scanning comprises sequentially scanning, for exposure, a subsequent laser spot array so that at least a half region of a previously scanned laser spot array in the width direction thereof is subjected to superimposed exposure.

4. A product according to claim 3, wherein a number of the plurality of laser beams is odd.

* * * * *